United States Patent
Larsen (10) Patent No.: US 6,748,293 B1
(45) Date of Patent: Jun. 8, 2004

(54) METHODS AND APPARATUS FOR HIGH SPEED OBJECT HANDLING

(75) Inventor: Grant Kenji Larsen, Gloucester, MA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 10/395,940

(22) Filed: Mar. 24, 2003

(51) Int. Cl.$^7$ ................................. G06F 7/00
(52) U.S. Cl. .............. 700/218; 700/245; 700/248; 700/259; 414/936; 414/937; 414/939; 414/941; 414/800; 414/810; 414/811
(58) Field of Search .................. 700/213, 214, 700/218, 245, 248, 259; 414/217, 226.05, 800, 805, 810, 811, 935, 936, 937, 939, 941

(56) References Cited

U.S. PATENT DOCUMENTS

| | | |
|---|---|---|
| 3,901,183 A | 8/1975 | Wittkower |
| 4,008,683 A | 2/1977 | Rose |
| 4,282,924 A | 8/1981 | Faretra |
| 4,695,215 A | 9/1987 | Jacoby et al. |
| 4,836,733 A | 6/1989 | Hertel et al. |
| 5,083,896 A | 1/1992 | Uehara et al. |
| 5,186,594 A | 2/1993 | Toshima et al. |
| 5,286,296 A | 2/1994 | Sato et al. |
| 5,404,894 A | 4/1995 | Shiraiwa |
| 5,486,080 A | 1/1996 | Sieradzki |
| 6,007,675 A * | 12/1999 | Toshima ................ 156/345.32 |
| 6,045,315 A * | 4/2000 | Azumano et al. ........... 414/217 |
| 6,114,705 A | 9/2000 | Leavitt et al. |
| 6,120,601 A | 9/2000 | Landau et al. |
| 6,315,512 B1 * | 11/2001 | Tabrizi et al. ............. 414/217 |
| 6,428,262 B1 * | 8/2002 | Vanderpot et al. .......... 414/217 |
| 6,481,956 B1 * | 11/2002 | Hofmeister ................ 414/806 |

FOREIGN PATENT DOCUMENTS

| | | |
|---|---|---|
| JP | 64-64231 A | 3/1989 |
| WO | WO 91/04213 A1 | 4/1991 |

* cited by examiner

*Primary Examiner*—Khoi H. Tran (57) ABSTRACT

Methods and apparatus for high speed workpiece handling are provided. The method for workpiece handling includes removing a workpiece from a first cassette with a first robot, transferring the workpiece from the first robot directly to a second robot without transferring the workpiece to a transfer station, placing the workpiece on a workpiece holder at a processing station with the second robot, and transferring the workpiece from the workpiece holder to the first cassette with the first robot following processing. End effectors of the first and second robots may each have a plurality of vertical positions for efficient workpiece handling. Displacement error and rotational error of the workpiece may be sensed and corrected without use of a transfer station. The methods and apparatus may be used for handling semiconductor wafers.

26 Claims, 10 Drawing Sheets

Robot 1 reaches into cassette

FIG. 2B

Robot 1 lifts wafer out of cassette

Robot 1 reaches over Robot 2

FIG. 4B

Robot 2 lifts to take wafer from Robot 1

Robot 1 reaches into cassette
Robot 2 places wafer over plater 1

Platen pins in UP position

FIG. 5B

Robot 2 deposits wafer
Robot 1 lifts wafer out of cassette

Platen pins UP wafer on pins

METHODS AND APPARATUS FOR HIGH SPEED OBJECT HANDLING

FIELD OF THE INVENTION

This invention relates to high speed object handling and, more particularly, to methods and apparatus for moving workpieces, such as semiconductor wafers, in a vacuum chamber for high processing throughput.

BACKGROUND OF THE INVENTION

The processing of semiconductor wafers for the manufacture of microelectronic circuits involves processing tools for performing a large number of processing steps. The processing steps are usually performed in a vacuum chamber. The processing tools typically handle and process wafers one at a time in order to optimize control and reproducibility. Such processing tools utilize automated wafer handling systems.

The throughput of the processing tools is an important factor in achieving low cost manufacture. The overall throughput is a function of both the processing time and the efficiency of automated wafer handling. Wafer handling involves introduction of the wafers in a cassette or other wafer holder into the vacuum chamber, typically through a load lock, transfer of the wafers from the cassette to a processing station, return of the wafers to the cassette following processing and removal of the cassette from the load lock. Some processes, such as for example ion implantation, may require a specified wafer orientation during processing. In addition, a wafer may be damaged or destroyed if it is inadvertently displaced from its normal position in the wafer handling system. Accordingly, wafer handling systems may utilize wafer position sensing and correction systems. Some of the processing and wafer handling operations may be performed concurrently to achieve efficient operation and high throughput. Accordingly, careful design of wafer handling systems is required. A variety of wafer handling techniques are known in the prior art.

In one prior art system disclosed in U.S. Pat. No. 5,486,080, issued Jan. 23, 1996 to Sieradzki, a pair of robot arms transfers wafers from a cassette to a transfer station and then to a processing station. After wafers in a first cassette have been processed, the robots reverse their respective roles and begin processing wafers in a second cassette, while the load lock of the first cassette is vented and the first cassette is replaced with a new cassette.

In another prior art system disclosed in U.S. Pat. No. 6,114,705, issued Sep. 5, 2000 to Leavitt et al., robot arms transfer wafers directly from a cassette to a processing station. Wafer position errors are sensed with a camera, and displacement errors are corrected by the robot arm as it places the wafer on a wafer holder at the processing station. The wafer holder at the processing station rotates to correct rotational error. The wafer is placed in a different cassette after processing.

Current wafer fabrication processes typically require that wafers be returned to the same cassette following processing for increased process control. This requirement increases the difficulty of achieving high throughput.

All of the known prior art wafer handling systems have had one or more drawbacks, including but not limited to relatively low throughput and high cost. Accordingly, there is a need for improved methods and apparatus for high speed handling of workpieces such as semiconductor wafers.

SUMMARY OF THE INVENTION

According to a first aspect of the invention, a method is provided for workpiece handling. The method comprises: (a) removing a workpiece from a first cassette with a first robot, (b) transferring the workpiece from the first robot directly to a second robot without transferring the workpiece to a transfer station, (c) placing the workpiece on a workpiece holder at a processing station with the second robot, and (d) transferring the workpiece from the workpiece holder to the first cassette with the first robot following processing.

The method may further comprise (e) repeating steps (a)–(d) for remaining workpieces in the first cassette. In addition, the method may further comprise (f) reversing roles of the first robot and the second robot and repeating steps (a)–(e) for workpieces in a second cassette. The method may be used for handling semiconductor wafers, but is not limited to wafer handling.

The method may further comprise sensing displacement error and rotational error of the workpiece relative to reference values and correcting the displacement error and the rotational error of the workpiece without use of a transfer station. The displacement error may be corrected with the second robot, and the rotational error may be corrected with the workpiece holder. The displacement error and the rotational error may be sensed by acquiring an image of the workpiece to provide image data and processing the image data to determine the displacement error and rotational error relative to the reference values.

The first and second robots may each include an end effector that is laterally and vertically movable. In some embodiments, the end effectors of the first and second robots each have a plurality of discrete vertical positions.

The discrete vertical positions of the first and second robots permit the second robot to position a second workpiece above the workpiece holder before a first workpiece is removed from the workpiece holder by the first robot. The workpiece can be transferred from the first robot directly to the second robot by the first robot positioning the workpiece over an end effector of the second robot and the second robot lifting the workpiece from the first robot.

According to another aspect of the invention, a workpiece handling system is provided. The workpiece handling system comprises a vacuum chamber, a processing station within the vacuum chamber, first and second load locks controllably coupled to the vacuum chamber through first and second isolation valves, respectively, and first and second robots within the vacuum chamber for transferring workpieces to and between the load locks and the processing station. The first and second robots each have a robot arm that is vertically movable to different levels and that is laterally movable to permit direct robot-to-robot transfer of workpieces without transferring workpieces to a transfer station. The workpiece handling system may be used for handling semiconductor wafers, but is not limited to wafer handling.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
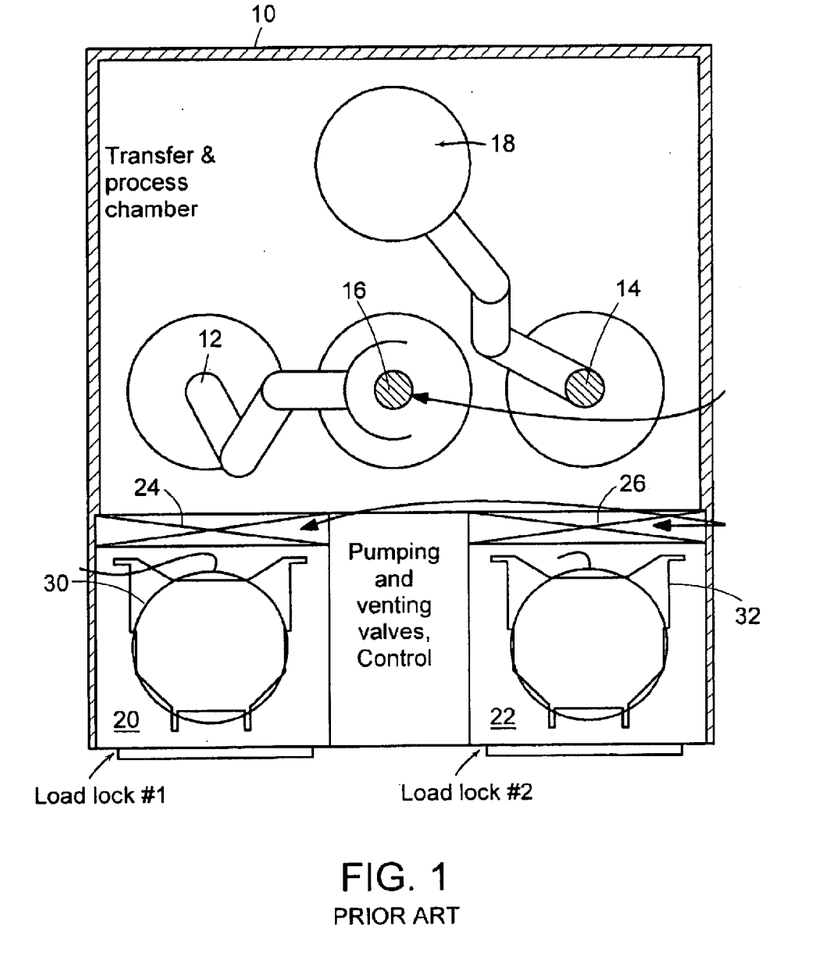
FIG. 1 is a schematic top view of a prior art wafer handling system.

A prior art wafer handling system of the type disclosed in the aforementioned U.S. Pat. No. 5,486,080 is shown in FIG. 1. A vacuum chamber 10 contains a first robot 12, a second robot 14, a transfer station 16 and a processing station 18. Load locks 20 and 22 communicate with vacuum chamber 10 through isolation valves 24 and 26, respectively. Cassettes 30 and 32, each holding a plurality of semiconductor wafers, are placed in the respective load locks 20 and 22.

In operation, a wafer is removed from cassette 30 by first robot 12 and is placed on transfer station 16. Transfer station 16 includes a wafer support and a position sensor, which determines the displacement error and rotational error of the wafer with respect to reference values. Position sensing typically requires rotating the wafer with respect to the sensor. The rotational error is corrected by an appropriate rotation of the wafer support at transfer station 16. The wafer is then transferred to processing station 18 by second robot 14 with an appropriate adjustment to eliminate displacement error. After processing, the wafer is returned to cassette 30 by first robot 12.

Figure 2A:
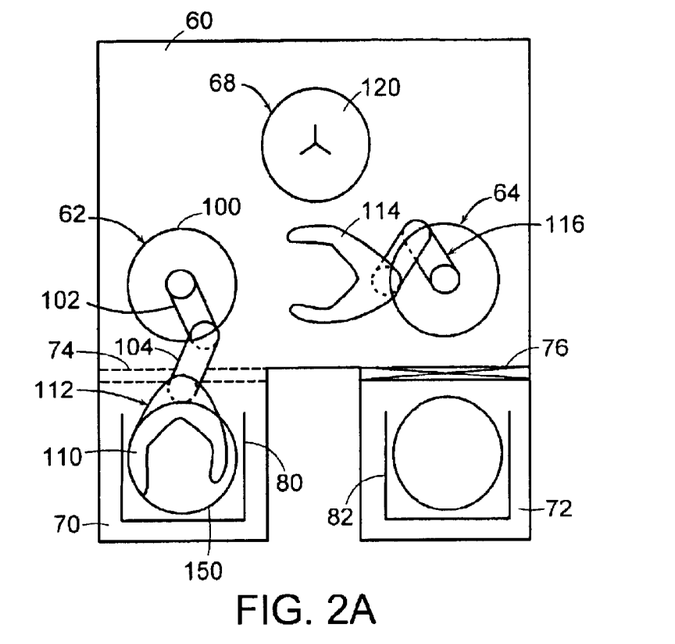
FIG. 2A is a schematic top view of a wafer handling system in accordance with an embodiment of the invention, showing a wafer being removed from a cassette.

Referring now to FIG. 2A, a top view of a workpiece handling system in accordance with an embodiment of the invention is shown. The workpiece handling system is advantageously used for handling semiconductor wafers, but is not limited to wafer handling. Hereinafter, the system is called a "wafer handling system."

The wafer handling system includes a first robot 62, a second robot 64 and a processing station 68 positioned within a vacuum chamber 60. The wafer handling system further includes load locks 70 and 72 that communicate with vacuum chamber 60 through isolation valves 74 and 76, respectively. Cassettes 80 and 82, each holding a plurality of semiconductor wafers, may be positioned in the respective load locks 70 and 72. It will be understood that different types of wafer holders may be utilized within the scope of the invention. Load locks 70 and 72 are provided with elevators 84 and 86, respectively, (FIG. 9) for indexing cassettes 80 and 82 upwardly and downwardly with respect to robots 62 and 64.

Each of robots 62 and 64 includes a fixed base 100, a first arm section 102, a second arm section 104, and an end effector 110. End effector 110 may be a U-shaped element that is dimensioned for supporting a semiconductor wafer of specified diameter. Arm sections 102 and 104 and end effector 110 are pivotally connected to each other and to base 100 to permit lateral movement as well as extension and retraction of end effector 110. Arm sections 102 and 104 and end effector 110 of robot 62 constitute a robot arm 112. Similar components of robot 64 constitute a robot arm 116.

Robot arms 112 and 116 are vertically movable, typically to a plurality of discrete positions or levels. In the embodiment of FIG. 2A, each robot arm is vertically movable to one of three positions. However, the invention is not limited to three positions, and more or fewer positions may be utilized.

Robots 62 and 64 are positioned in vacuum chamber 60 to permit access to load locks 70 and 72, respectively, to permit robot-to-robot transfer of wafers and to permit access to processing station 68. The wafer handling system may include a wafer positioning system 130 (FIG. 9), as described below in connection with FIG. 7.

Processing station 68 includes a wafer holder 120. By way of example, wafer holder 120 may include an electrostatic wafer clamp as known in the art and may include wafer lift pins 122 for lifting a wafer above a clamping surface. The wafer lift pins 122 permit a wafer to be placed on wafer holder 120 by robots 62 and 64 and to be removed from wafer holder 120 following processing. Wafer holder 120 may further include a rotation mechanism for rotating the wafer to eliminate rotational error as described below. Processing station 68 may be part of an ion implantation system, for example. In this embodiment, wafer holder 120 may pivot the wafer to a vertical orientation for ion implantation. However, the wafer handling system described herein is not limited to ion implantation and may be utilized with different types of processing systems.

Load locks 70 and 72 permit cassettes 80 and 82 to access vacuum chamber 60 without requiring vacuum chamber 60 to be vented to atmospheric pressure. In particular, the respective isolation valves 74 and 76, may be closed, thereby isolating load locks 70 and 72 from vacuum chamber 60. Load locks 70 and 72 may be vented to atmospheric pressure, and cassettes 80 and 82 may be exchanged by a system operator or by a robot (not shown). The load lock is then sealed and vacuum pumped, and the isolation valve is opened, thereby providing access to vacuum chamber 60. Typically, one cassette may be processed while another cassette of processed wafers is replaced with a cassette of unprocessed wafers. The wafer handling system includes a vacuum pumping system 90 (FIG. 9) for controlling the pressure level in vacuum chamber 60 and load locks 70 and 72.

Figure 9:
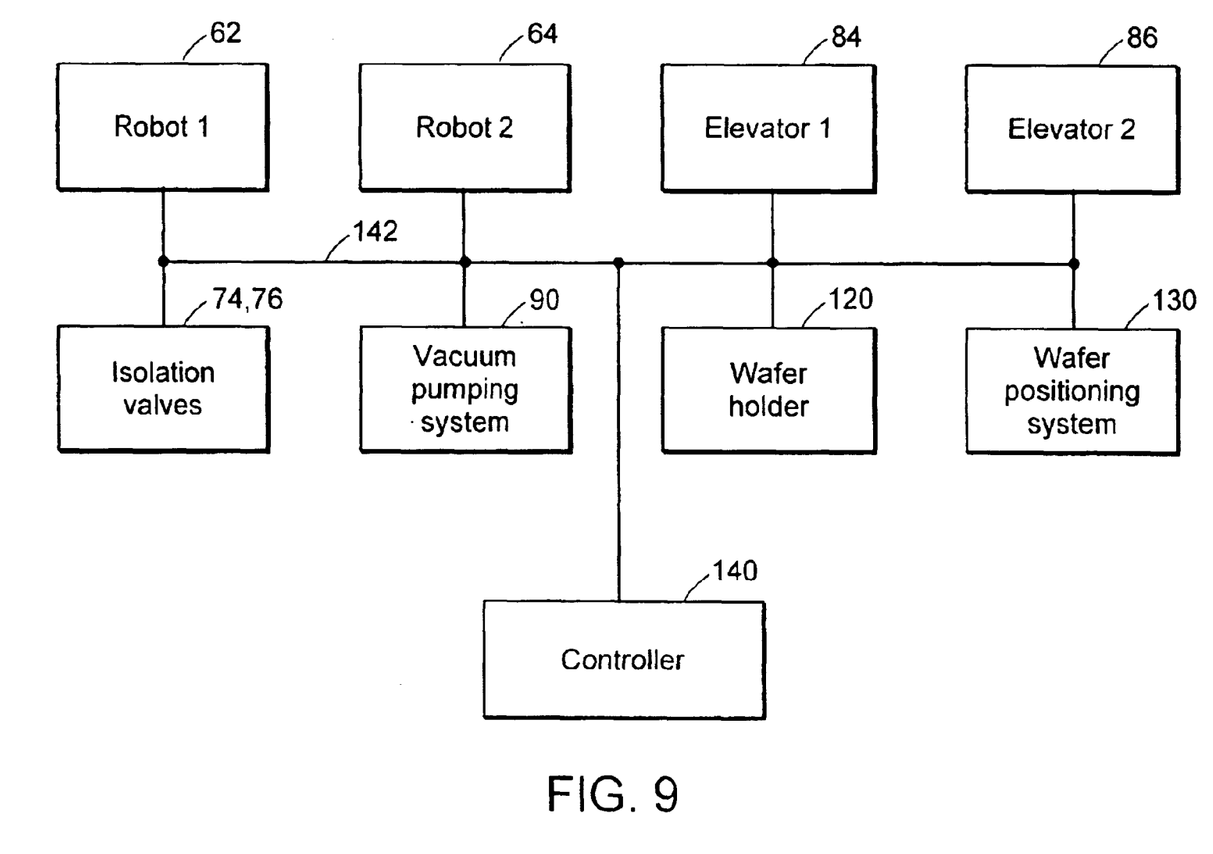
FIG. 9 is a schematic block diagram of the wafer handling system of FIG. 2A.

As shown in FIG. 9, the wafer handling system includes a controller 140 for controlling the elements of the wafer handling system. Controller 140 may be coupled by a suitable control bus 142 or by separate connections to robots 62 and 64, elevators 84 and 86, isolation valves 74 and 76, vacuum pumping system 90, wafer holder, 120 and wafer positioning system 130. Controller 140 may be a general purpose computer, such as a personal computer (PC), or a special purpose controller. Controller 140 controls the elements of the wafer handling system to perform wafer handling as described herein.

Figures 8, 8A:
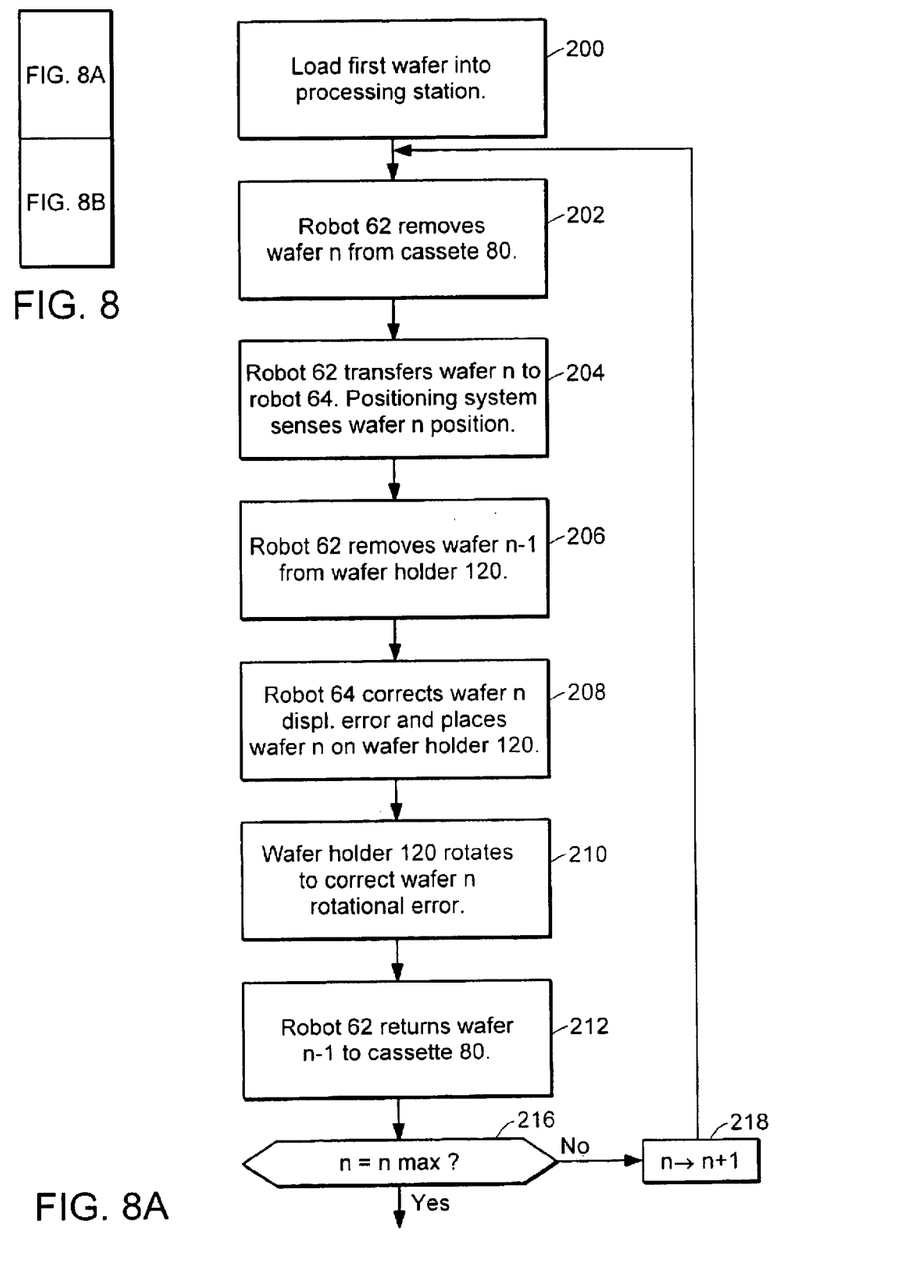
FIGS. 8A and 8B show a flow chart of a wafer handling process in accordance with an embodiment of the invention.
Figure 8B:
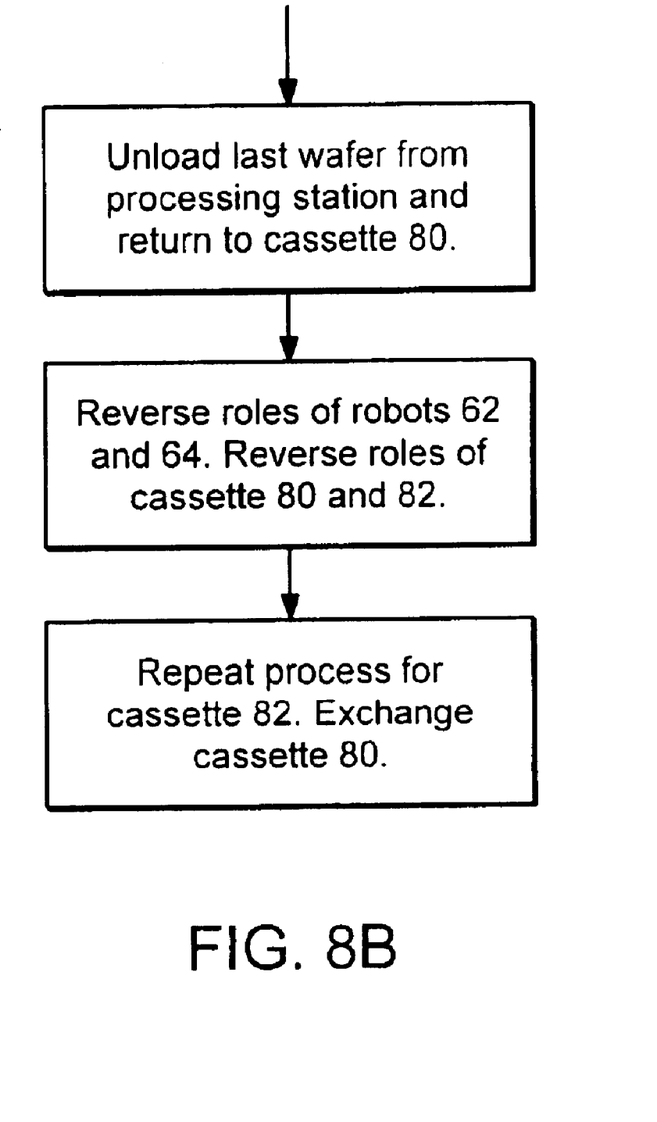

FIGS. 2A–6E illustrate basic operations of the wafer handling system as described below. The basic operations and other operations are combined to illustrate an example of a wafer handling process, as shown in FIGS. 8A and 8B and described below.

Figure 2B:
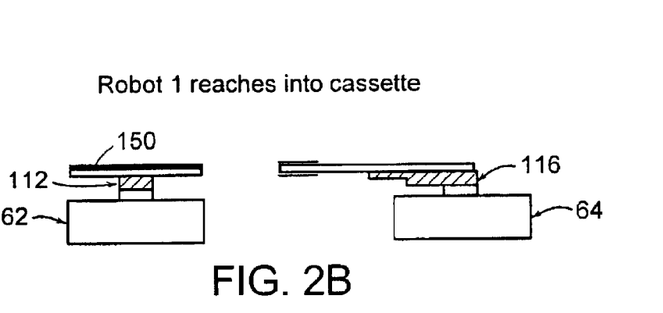
FIGS. 2B and 2C are schematic side views of the first and second robots in the wafer handling system of FIG. 2A, showing the wafer being removed from the cassette.
Figure 2C:
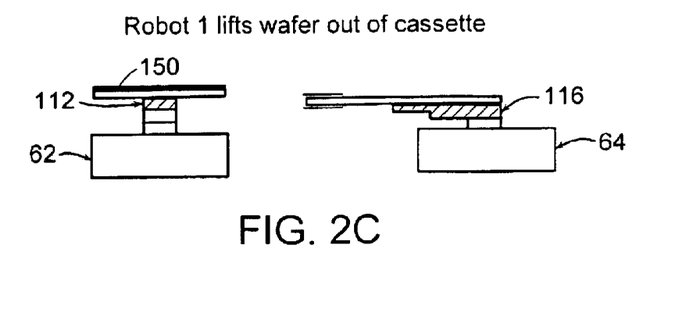
Figure 3:
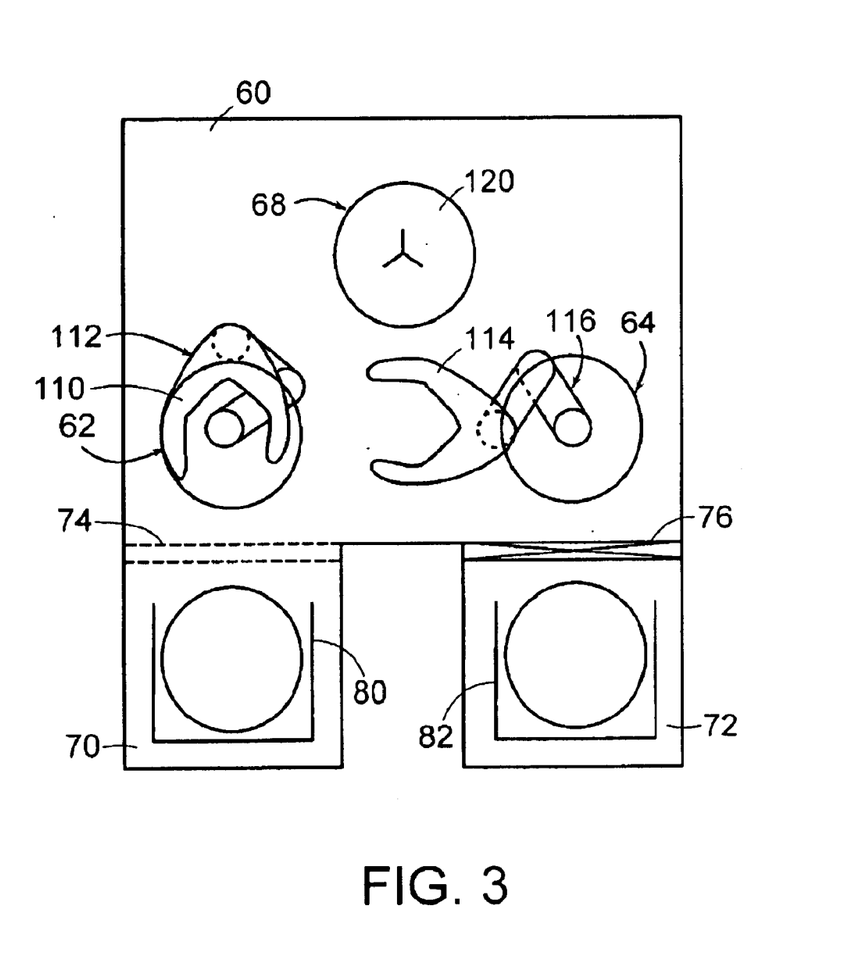
FIG. 3 is a schematic top view of the wafer handling system of FIG. 2A, showing a wafer removed from the cassette.

FIGS. 2A–2C and 3 illustrate removal of a wafer 150 from cassette 80 by first robot 62. As shown in FIGS. 2A and 2B, robot arm 112 of robot 62 is moved, if necessary, to its lowest vertical position, and end effector 110 is extended into cassette 80 under wafer 150. Robot arm 112 is then raised to an intermediate vertical position, as shown in FIG. 2C, so as to lift wafer 150 from cassette 80, and end effector 110 carrying wafer 150 is withdrawn from cassette 80 to the position shown in FIG. 3. To return wafer 150 to cassette 80, the operations described above are performed in reverse. That is, robot arm 112 carrying wafer 150 is moved, if necessary, to its intermediate vertical position, and end effector 110 carrying wafer 150 is extended into cassette 80. Robot arm 112 is then moved to its lowest vertical position, as shown in FIG. 2B, and end effector 110 is withdrawn from cassette 80, with wafer 150 remaining in cassette 80. The use of vertically movable robot arms 112 and 116 avoids the need for multiple indexing of cassette elevators 84 and 86 to remove and replace wafers in cassettes 80 and 82. Nonetheless, cassette elevators having indexing capability may be utilized if desired.

Figure 4A:
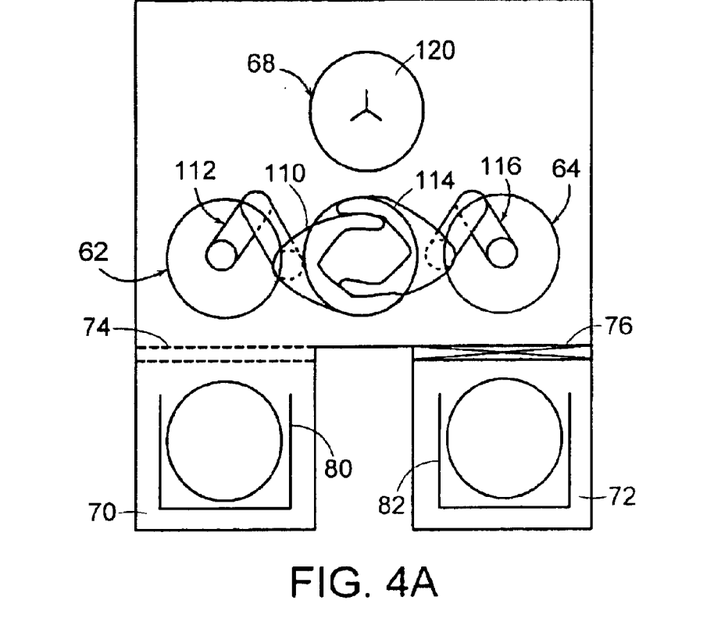
FIG. 4A is a schematic top view of the wafer handling system of FIG. 2A, showing robot-to-robot wafer transfer.
Figure 4B:
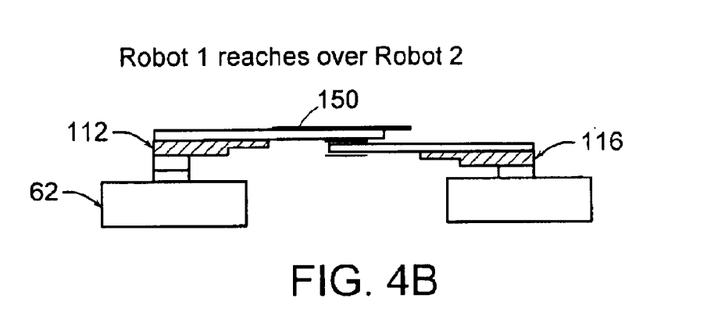
FIGS. 4B and 4C are side views of the first and second robots of FIG. 4A, showing robot-to-robot wafer transfer.
Figure 4C:
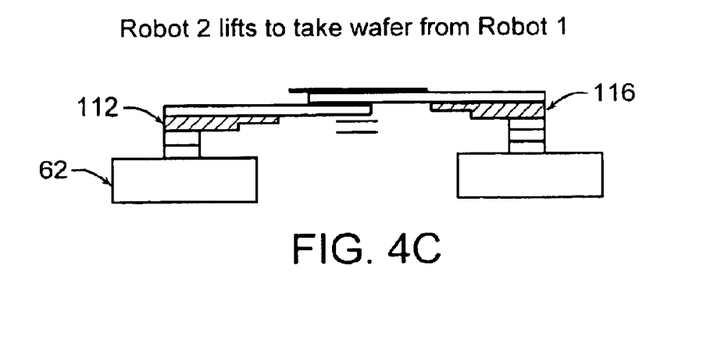

Transfer of wafer 150 from robot 62 to robot 64 is illustrated in FIGS. 4A–4C. The transfer may take place at a position between robots 62 and 64. As shown in FIG. 4B, end effector 110 of robot 62 extends wafer 150 over end effector 114 of robot 64. End effectors 110 and 114 are shaped and positioned such that each end effector may be moved vertically without interference with the other end effector. In the embodiment of FIG. 4A, U-shaped end effectors 110 and 114 may have the same size and shape and are offset laterally to permit unrestricted vertical movement. In this embodiment, wafer 150 is not centered with respect to one or both of end effectors 110 and 114. In another embodiment, end effectors 110 and 114 have different shapes and/or dimensions to permit centering of wafer 150 with respect to each end effector. For example, the spacing between the legs of the U-shaped end effectors may be different in end effectors 110 and 114 to permit both end effectors to be positioned under wafer 150 without interference.

In operation, robot arm 112 of robot 62 may be positioned at its intermediate vertical position, and robot arm 116 of robot 64 may be positioned at its lowest vertical position. Robot arm 112 of robot 62 is then extended to position wafer 150 over end effector 114 of robot 64. Robot arm 116 of robot 64 is raised to its highest vertical position, as shown in FIG. 4C, such that end effector 114 lifts wafer 150 from end effector 110. The transfer is then complete. Robot arm 112 can be retracted to perform other operations, and robot arm 116 can move wafer 150 to processing station 68.

By utilizing robot-to-robot wafer transfer, the wafer handling system avoids the need for a transfer station. In cases where a wafer positioning system is utilized, wafer position sensing and correction are performed without the need for a transfer station. A suitable wafer positioning system is described below.

Figure 5A:
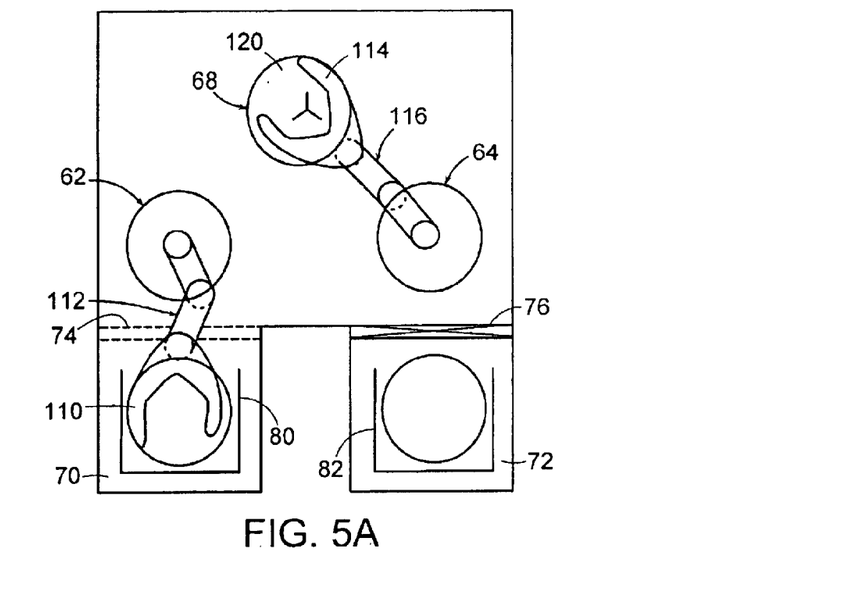
FIG. 5A is a schematic top view of the wafer handling system of FIG. 2A, showing placement of a first wafer on a wafer holder at a processing station and removal of a second wafer from the cassette.
Figure 5B:
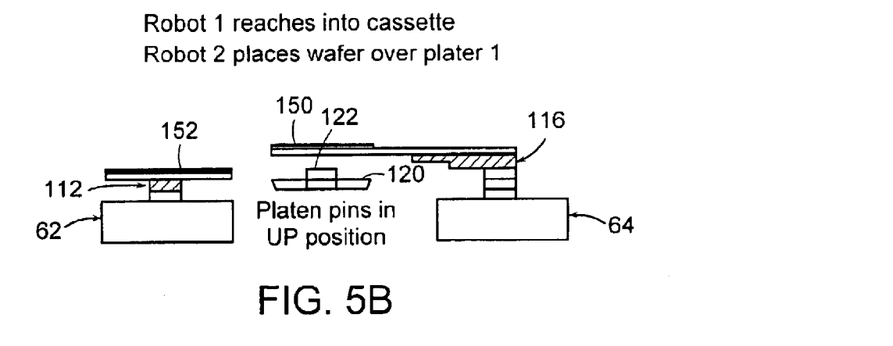
FIGS. 5B and 5C are schematic side views of the first and second robots, showing wafer placement on the wafer holder and wafer removal from the cassette.
Figure 5C:
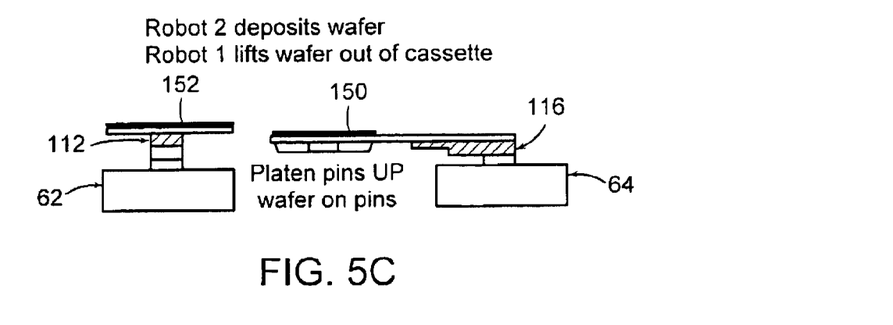

A further basic operation, including transfer of wafer 150 by robot 64 to wafer holder 120 and removal of another wafer from cassette 80, is shown in FIGS. 5A–5C. As shown in FIG. 5B, robot arm 116 of robot 64 is positioned at its highest vertical position with wafer 150 located over wafer holder 120. The lift pins in wafer holder 120 are raised above the platen surface for receiving wafer 150. The lift pins are located on wafer holder 120 to avoid interference with end effector 114 as robot arm 116 is raised and lowered. Robot arm 116 is then moved to its lowest vertical position, as shown in FIG. 5C, thereby transferring wafer 150 to the lift pins of wafer holder 120. Robot arm 116 may then be retracted from wafer holder 120, and lift the lift pins may be lowered to thereby position wafer 150 on the wafer clamping surface of wafer holder 120.

Concurrently with positioning wafer 150 on wafer holder 120, robot 62 may remove a second wafer 152 from cassette 80. As shown in FIG. 5B, robot arm 112 is moved at its lowest vertical position and end effector 110 is positioned under wafer 152. Robot arm 112 is then raised to its intermediate vertical position, as shown in FIG. 5C, and wafer 152 is removed from cassette 80.

Figure 6A:
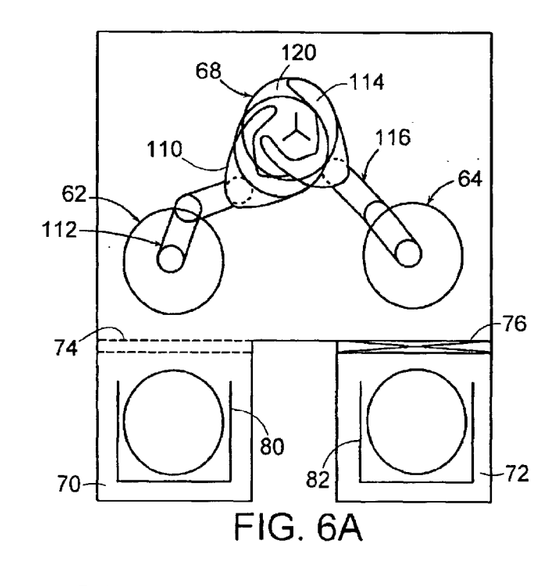
FIG. 6A is a schematic block diagram of the wafer handling system of FIG. 2A, showing transfer of one wafer from the wafer holder by the first robot and positioning of another wafer above the wafer holder by the second robot.
Figure 6B:
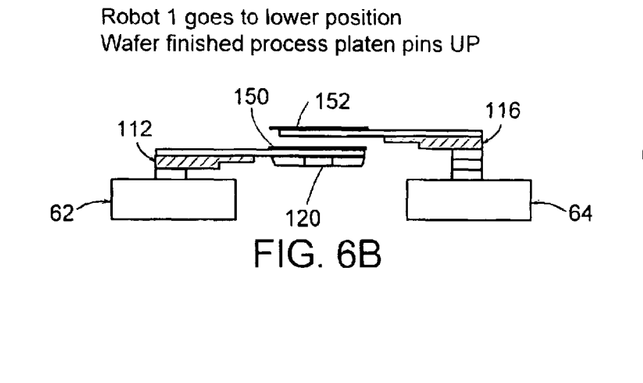
FIGS. 6B–6E are side views of the first and second robots, showing exchange of wafers on the wafer holder.
Figure 6C:
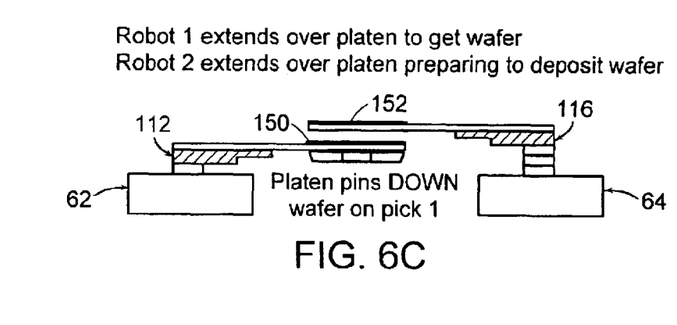
Figure 6D:
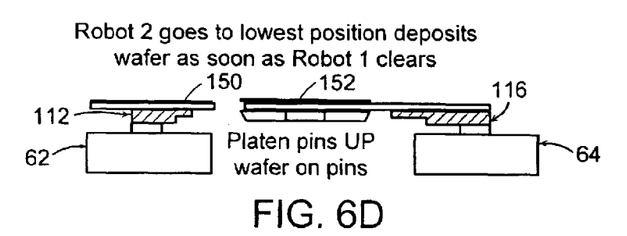
Figure 6E:
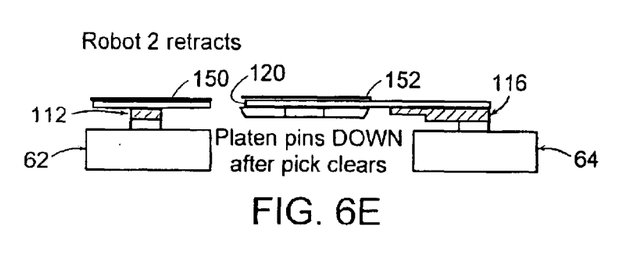

An exchange of wafers on wafer holder 120 is illustrated in FIGS. 6A–6E. Robot 62 removes wafer 150 from wafer holder 120 following processing, and robot 64 then places wafer 152 on wafer holder 120 for processing. As shown in FIG. 6B, robot arm 112 of robot 62 is positioned at its lowest vertical position, and robot arm 116 carrying wafer 152 is positioned at its highest vertical position. The lift pins of wafer holder 120 are raised, thereby lifting wafer 150 from the clamping surface of wafer holder 120. Robot arm 112 of robot 62 is extended to position end effector 110 between wafer 150 and the clamping surface of wafer holder 120, and robot arm 116 of robot 64 is extended to position wafer 152 above wafer holder 120, as shown in FIG. 6C. Robot arm 112 is then retracted, so as to remove wafer 150 from wafer holder 120. When wafer 150 is clear of wafer holder 120, robot arm 116 of robot 64 its lowered to its lowest vertical position, and wafer 152 is positioned on the lift pins of wafer holder 120, as shown in FIG. 6D. Robot arm 116 of robot 64 is then retracted, and the lift pins of wafer holder 120 are lowered to thereby position wafer 152 on the clamping surface of wafer holder 120. The exchange of wafers is thereby completed.

Ion implantation typically requires orientation of the wafer with respect to the ion beam in order to control channeling effects. Because the positions of wafers in cassettes are not tightly controlled and because wafer handling systems may produce undesired wafer movements as the wafer is transferred from the cassette to the processing station, wafer positioning systems may be used to sense and correct wafer position errors. Such position errors may include displacement errors (eccentricity) and rotational errors relative to desired positions.

Figure 7:
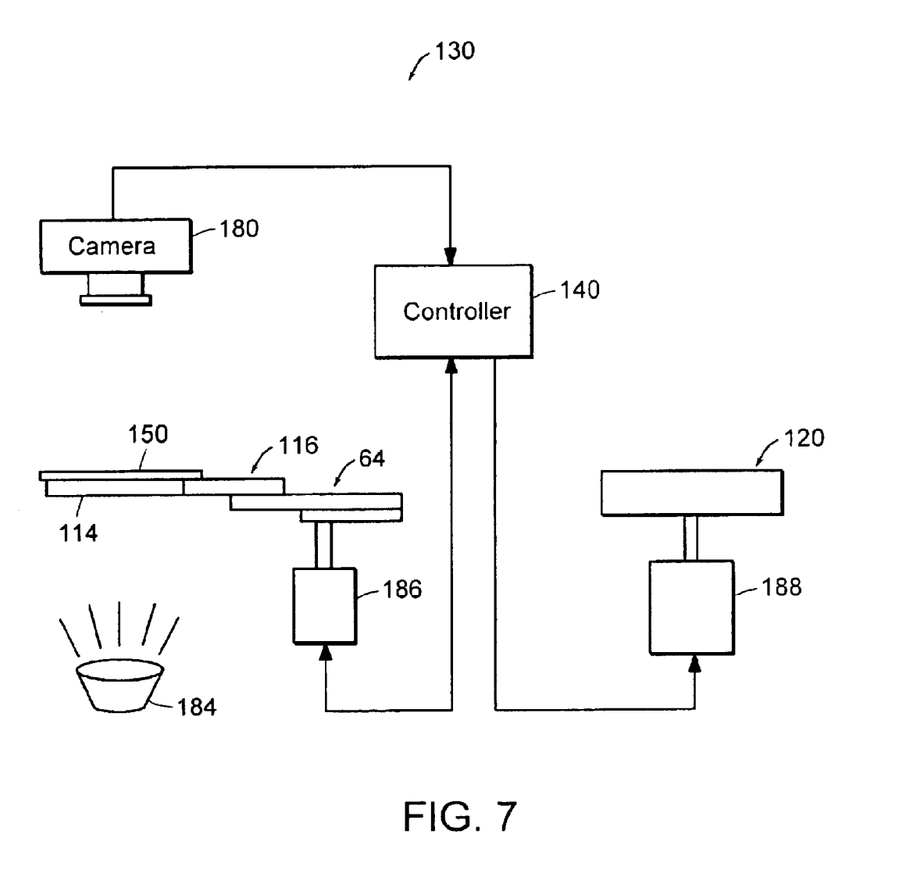
FIG. 7 is a schematic block diagram of an embodiment of a wafer orientation system that may be utilized in the wafer handling system of FIG. 2A.

An embodiment of wafer positioning 130 system suitable for use in the wafer handling system of FIG. 2A is shown in FIG. 7. A camera 180 acquires an image of wafer 150 on end effector 114 of robot 64. An optional light source 184 may illuminate wafer 150 from below as shown. In another embodiment, a light source (not shown) may illuminate wafer 150 from above. Image data from camera 180 is supplied to the controller 140 of the wafer handling system. Image analysis analysis software in controller 140 analyzes the image data to determine displacement error of wafer 150 with respect a desired position on end effector 114 and rotational error of wafer 150 with respect to a desired rotational position. Controller 140 supplies a control signal to motor 186 of robot 64 to correct sensed displacement error as wafer 150 is placed on wafer holder 120. In particular, the placement of wafer 150 on wafer holder 120 is adjusted to compensate for the sensed displacement error. In addition, controller 140 supplies a control signal to a motor 188 in wafer holder 120. After wafer 150 is positioned on wafer holder 120, wafer holder 120 is rotated by motor 188 to compensate for sensed rotational error. Additional details regarding the wafer positioning system are disclosed in the aforementioned U.S. Pat. No. 6,144,705, which is hereby incorporated by reference. As an alternative, an image of wafer 150 can be obtained while wafer 150 is positioned on robot 62. However, any slippage of wafer 150 during and after robot-to-robot transfer would not be taken into account in the position correction process.

The wafer positioning system is not limited to image sensing of wafer position errors. Sensing techniques including but not limited to RF electric field sensing, magnetic resonance sensing, laser scanning, and sensing with photo-detector arrays, for example, may be utilized for position sensing. Furthermore, some processing systems may be tolerant of wafer position errors and may not require the use of a wafer positioning system. In addition, systems for handling workpieces other than semiconductor wafers may or may not require accurate workpiece positioning and thus may or may not require workpiece positioning systems.

A flow chart of an example of a process for handling wafers in cassettes 80 and 82 is shown in FIGS. 8A and 8B. The process may be controlled by software in controller 140. The process involves basic operations shown in FIGS. 2A–2C, 3, 4A–4C, 5A–5C, 6A–6E and 7 and described above. In step 200, a first wafer is transferred from cassette 80 to processing station 68. The transfer of the first wafer in step 200 involves: (1) removal of the wafer from cassette 80, as shown in FIGS. 2A–2C and 3 and described above, (2) robot-to-robot transfer from robot 62 to robot 64, as shown in FIGS. 4A–4C and described above, (3) wafer position sensing and correction, as described above in connection with FIG. 7, and (4) and transfer of the wafer to wafer holder 120 by robot 64, as described above in connection with FIGS. 5A–5C.

When the first wafer has been loaded into the processing station 68, the process proceeds to step 202. In step 202, robot 62 removes wafer n (where n is a wafer number or index) from cassette 80, as shown in FIGS. 2A–2C and 3 and described above. In step 204, robot 62 transfers wafer n to robot 64, as shown in FIGS. 4A–4C and described above. Also in step 204, wafer positioning system 130 senses the displacement error and rotational error of wafer n, as described above in connection with FIG. 7. In step 206, robot 62 removes wafer n−1 from wafer holder 120, as described above in connection with FIGS. 6A–6C. In step 208, robot 64 places wafer n on wafer holder 120, as described above in connection with FIGS. 6A, 6D and 6E, and the placement is adjusted to correct the sensed displacement error of wafer n, as described above in connection with FIG. 7. In step 210, wafer holder 120 rotates to correct the sensed rotational error of wafer n, as described above in connection with FIG. 7. In step 212, robot 62 returns wafer n−1 to cassette 80, as described above in connection with FIGS. 2A–2C. In step 216, a determination is made as to whether wafer n is the last wafer in the cassette (n=$n_{max}$). If wafer n is not the last wafer, wafer index n is incremented in step 218 and elevator 84 indexes cassette 80 for access to the next wafer. The process then returns to step 202 to remove the next wafer from cassette 80. The next wafer is processed in the same manner. If a determination is made in step 216 that wafer n (currently on the wafer holder) is the last wafer, wafer n is unloaded from the processing station 68 and returned to cassette 80 in step 220, as described above in connection with steps 206 and 212.

With the completion of step 220, all wafers in cassette 80 have been processed and returned to cassette 80. In step 230, the roles of robots 62 and 64 are reversed in the wafer handling process to permit processing of wafers in cassette 82. In step 232, the process of steps 200–220 is repeated for cassette 82, and cassette 80 can be exchanged for a new cassette containing unprocessed wafers. The process thus continues with processing of alternate cassettes and with wafers being returned to the cassettes from which they were removed.

The workpiece handling system described herein is advantageously used for handling semiconductor wafers and other disk-shaped workpieces. However, the invention is not limited in this regard and may be utilized for handling other types of workpieces, with appropriate modifications to the system elements that support and move the workpieces.

Having thus described several aspects of at least one embodiment of this invention, it is to be appreciated various alterations, modifications, and improvements will readily occur to those skilled in the art. Such alterations, modifications, and improvements are intended to be part of this disclosure, and are intended to be within the spirit and scope of the invention. Accordingly, the foregoing description and drawings are by way of example only.

What is claimed is:

1. A method for workpiece handling comprising:
   (a) removing a workpiece from a first cassette with a first robot;
   (b) transferring the workpiece from the first robot directly to a second robot without transferring the workpiece to a transfer station;
   (c) placing the workpiece on a workpiece holder at a processing station with the second robot; and
   (d) transferring the workpiece from the workpiece holder to the first cassette with the first robot following processing.

2. A method as defined in claim 1, further comprising:
   (e) repeating steps (a)–(d) for remaining workpieces in the first cassette.

3. A method as defined in claim 2, further comprising:
   (f) reversing roles of the first robot and the second robot and repeating steps (a)–(e) for workpieces in a second cassette.

4. A method as defined in claim 1, wherein step (c) includes the second robot positioning a second workpiece above the workpiece holder before a first workpiece is removed from the workpiece holder by the first robot.

5. A method as defined in claim 1, further comprising sensing displacement error and rotational error of the workpiece relative to reference values and correcting the displacement error and the rotational error of the workpiece without use of a transfer station.

6. A method as defined in claim 5, wherein correcting displacement error and rotational error comprises correcting displacement error with the second robot and correcting rotational error with the workpiece holder.

7. A method as defined in claim 5, wherein sensing displacement error and rotational error comprises:
   acquiring an image of the workpiece to provide image data and processing the image data to determine the displacement error and the rotational error relative to the reference values.

8. A method as defined in claim 5, wherein sensing displacement error and rotational error comprises:
acquiring measurements of the workpiece and processing the measurements to determine the displacement error and the rotational error relative to the reference values.

9. A method as defined in claim 8, wherein acquiring measurements uses a sensing technique selected from the group consisting of RF electric field sensing, magnetic resonance sensing, laser scanning and sensing with photodetector arrays.

10. A method as defined in claim 1, wherein said first and second robots each include an end effector that is laterally and vertically movable.

11. A method as defined in claim 10, wherein the end effectors of said first and second robots each have a plurality of discrete vertical positions.

12. A method as defined in claim 1, wherein step (b) comprises the first robot positioning the workpiece over an end effector of the second robot and the second robot lifting the workpiece from the first robot.

13. A method as defined in claim 1, wherein step (a) comprises extending an end effector of the first robot into the cassette under the workpiece, raising the end effector, and retracting the end effector of the first robot from the first cassette.

14. A method as defined in claim 4, wherein positioning a second workpiece above the workpiece holder comprises the first robot positioning a first end effector at a first vertical position and extending the first end effector under the first workpiece and the second robot positioning a second end effector at a second vertical position and extending the second end effector carrying the second workpiece over the workpiece holder.

15. A method as defined in claim 1, wherein step (b) comprises the first robot positioning a first end effector and the second robot positioning a second end effector to avoid interference between the first and second end effectors when at least one of the end effectors is moved vertically.

16. A method as defined in claim 1, wherein steps (a)–(d) are adapted for handling a semiconductor wafer.

17. A workpiece handling system comprising:
a vacuum chamber;
a processing station within the vacuum chamber;
first and second load locks controllably coupled to the vacuum chamber through first and second isolation valves, respectively; and
first and second robots within the vacuum chamber for transferring workpieces to and between the load locks and the processing station, the first and second robots each having a robot arm that is vertically movable to different levels and that is laterally movable to permit direct robot-to-robot transfer of workpieces without transferring workpieces to a transfer station.

18. A workpiece handling system as defined in claim 17, further comprising a controller for controlling the first and second robots.

19. A workpiece handling system as defined in claim 18, wherein said controller includes means for removing a workpiece from a first cassette with the first robot, means for transferring the workpiece from the first robot directly to the second robot, means for placing the workpiece on a workpiece holder at the processing station with the second robot, and means for transferring the workpiece from the workpiece holder to the first cassette with the first robot following processing.

20. A workpiece handling system as defined in claim 19, wherein said controller further comprises means for handling workpieces in the first cassette.

21. A workpiece handling system as defined in claim 20, wherein said controller further comprises means for reversing roles of the first robot and the second the robot and for handling workpieces in a second cassette.

22. A workpiece handling system as defined in claim 19, wherein the means for placing the workpiece on a workpiece holder comprises means for positioning a second workpiece above the workpiece holder before a first workpiece is removed from the workpiece holder.

23. A workpiece handling system as defined in claim 19, further comprising a workpiece positioning system for sensing displacement error and rotational error of the workpiece relative to reference values and for correcting the displacement error and rotational error of the workpiece without use of a transfer station.

24. A workpiece handling system as defined in claim 23, wherein the workpiece positioning system comprises means for correcting displacement error with the second robot and means for correcting rotational error with the workpiece holder.

25. A workpiece handling system as defined in claim 23, wherein the workpiece positioning system comprises a vision system for acquiring an image of the workpiece to provide image data and for processing the image data to determine displacement error and rotational error relative to the reference values.

26. A workpiece handling system as defined in claim 17, wherein the first and second robots are configured for handling semiconductor wafers.

* * * * *